US005681764A

United States Patent [19]

Hess et al.

[11] Patent Number: 5,681,764

[45] Date of Patent: Oct. 28, 1997

[54] METHOD FOR FORMING A BIPOLAR INTEGRATED INK JET PRINTHEAD DRIVER

[75] Inventors: Ulrich E. Hess, Corvallis, Oreg.; James W. Grace, Los Altos Hills, Calif.; James R. Hulings, Fort Collins, Colo.; Jaime H. Bohorquez, Escondido, Calif.

[73] Assignee: Hewlett-Packard Company, Palo Alto, Calif.

[21] Appl. No.: 729,066

[22] Filed: Oct. 10, 1996

Related U.S. Application Data

[62] Division of Ser. No. 118,104, Sep. 7, 1993, Pat. No. 5,598, 189.

[51] Int. Cl.[6] .................................... H01L 21/265

[52] U.S. Cl. .................................... 437/31; 437/34; 437/51; 437/60

[58] Field of Search .................................... 437/31, 34, 51, 437/59, 60

[56] References Cited

U.S. PATENT DOCUMENTS

| | | | |
|---|---|---|---|
| 3,982,093 | 9/1976 | Henrion | 219/216 |
| 4,126,867 | 11/1978 | Stevenson, Jr. | 346/140 R |
| 4,490,728 | 12/1984 | Vaught et al. | 346/1.1 |
| 4,580,149 | 4/1986 | Domoto et al. | 346/140 R |
| 4,719,477 | 1/1988 | Hess | 346/140 R |
| 4,809,428 | 3/1989 | Aden et al. | 29/611 |
| 4,847,630 | 7/1989 | Bhaskar et al. | 346/1.1 |
| 4,875,968 | 10/1989 | O'Neal et al. | 156/633 |
| 4,881,089 | 11/1989 | Saito et al. | 346/140 R |
| 4,887,098 | 12/1989 | Hawkins et al. | 346/140 R |
| 5,083,137 | 1/1992 | Badyal et al. | 346/1.1 |
| 5,300,968 | 4/1994 | Hawkins | 346/140 R |
| 5,322,811 | 6/1994 | Komuno et al. | 437/51 |
| 5,517,224 | 5/1996 | Kaizu et al. | 347/59 |
| 5,567,630 | 10/1996 | Matsumoto et al. | 437/47 |

FOREIGN PATENT DOCUMENTS

| | | | |
|---|---|---|---|
| 0440459A | 1/1991 | European Pat. Off. | B41J 2/05 |
| 0441503A | 1/1991 | European Pat. Off. | B41J 2/16 |
| 0441635A | 2/1991 | European Pat. Off. | B41J 2/05 |

OTHER PUBLICATIONS

"Microelectronic Circuits", By: Adel S. Sedra & Kenneth C. Smith, 1991, Saunders College Publishing, p. 215 and p.1023.

*Primary Examiner*—Tuan H. Nguyen

[57] ABSTRACT

A bipolar ink jet driver circuit includes a plurality of individual driver cells having a common collector and a resistive heater element. A common collector obviates the need for any isolation between adjacent driver cells. The driver cells each include two bipolar transistors configured as a Darlington pair, which drive an associated resistive heater element. The cells are grouped together to form individual driver circuits each having a control line for enabling each driver circuit. The cells within each driver circuit are individually addressable via address lines which are coupled to each of the driver elements. The resistive heater elements are actuated by enabling a driver circuit and addressing a driver cell within the enabled driver circuit.

10 Claims, 10 Drawing Sheets

METHOD FOR FORMING A BIPOLAR INTEGRATED INK JET PRINTHEAD DRIVER

CROSS REFERENCE TO RELATED APPLICATION

This is a divisional of application Ser. No. 08/118,104 filed on Sep. 7, 1993, now U.S. Pat. No. 5,598,189.

BACKGROUND OF THE INVENTION

This invention relates generally to ink-jet printhead driver circuits and more particularly to bipolar integrated driver circuits.

Non-impact ink-jet printers are commonly known in the art. Ink-jet printers generate thermal energy, typically by passing a current through a resistive element, which causes an ink droplet to form. The ink droplet is ejected from an orifice, or nozzle, onto a predetermined position on a print media. A plurality of such ink drops are deposited on the print media to form a desired image. The construction of ink-jet printheads designed to accomplish this printing task is known in the art. Such ink-jet printheads consist of an ink-reservoir, the ink-nozzles, and the accompanying drive circuitry, including resistive elements.

Semiconductor drive circuits, which typically consist of a transistor or diode coupled to a thin-film resistor, are used to switch the thermal producing current to the desired resistor. FIG. 12 shows an NPN drive transistor, indicated generally at 920, formed on substrate 901, as is known in the art. Deposited on the substrate 901, over insulating layer 906, is a conductive layer 908 typically formed of Aluminum. A resistive layer 907 is formed of hafnium boride to act as a resistive element. A further insulating layer 909 is deposited over the conductive layer to insulate the Aluminum from the highly corrosive ink present in ink-passage 950, defined by top-plate 910 and ink-jet driver substrate 930.

The aforementioned drive circuit, however, suffers from well-known deficiencies, such as speed, cost, reliability, silicon area, and energy consumption. Several improved circuits have been designed which improve upon the basic design shown in FIG. 12. One such improved circuit is described in European Patent Application No. 91301019.5 by Matsumoto et al. for an Ink Jet Recording System. Referring to FIG. 13, a diode matrix drive circuit is shown as described by Matsumoto et al. By using a diode matrix for decoding, fewer interconnects are required, which produces a corresponding reduction in the silicon area required by the circuit.

Each of the diodes shown in FIG. 13 is constructed by forming an NPN drive transistor having a common base-collector electrode, as is known in the art. Referring now to FIG. 14, two such drive transistors SH1 and SH2 are shown. Drive transistor SH1 is formed on P- substrate 952, consisting of N type collector regions 954, 956, and 958, P type base regions 960 and 962, and an N+ type emitter region 964. Coupled to the base and collector regions is a common base-collector electrode 966, and coupled to the emitter region is electrode 968. A voltage supply VH is coupled to the common base-collector electrode 966 through an external pass transistor. The emitter electrode 968 is coupled to a resistive element RH1, which is further coupled to a common voltage supply through another external pass transistor. Drive transistor SH2 is similarly constructed.

Located between drive transistors SH1 and SH2 is a P type isolation region 970, which is connected to isolation electrode 974 through a heavily doped P-type isolation region 972. The P-type isolation region acts as an isolation domain, to minimize parasitic currents, which compromise the drive capability of the circuit. The isolation region, however, consumes valuable silicon area on the circuit.

Furthermore, the diode matrix design requires relatively low voltages to avoid exceeding the emitter-base breakdown voltage ("$BV_{EB}$") of the transistors. Exceeding the $BV_{EB}$ of the transistors can result in degradation of the transistor beta ("β") and perhaps make the transistor inoperable. In most processes, the emitter-base breakdown voltage is approximately 6–8 volts. Thus, relatively low voltages must be used. In order to produce the desired thermal dissipative energy, the diode matrix drivers typically require higher current levels, which results in higher power dissipation and lower long-term reliability.

Accordingly, a need remains for an integrated ink-jet printhead driver circuit which does not require an isolation region between adjacent drive transistors so as to minimize the silicon area of the drive circuit and which, further, uses lower current levels.

SUMMARY OF THE INVENTION

It is, therefore, an object of the invention to eliminate isolation domains between adjacent drive transistors in printhead driver circuits.

A further object of the invention is to construct a high gain printhead driver.

A first aspect of the invention is a bipolar ink jet driver cell that includes first and second bipolar transistors configured as a Darlington pair and a resistive heater element. The first and second transistors have a common collector, which obviates the need for an isolation domain between the first and second transistors or between adjacent cells. The first transistor in the pair has a Schottky diode formed across its base and collector to decrease the switching time of the cell. An address line is coupled to each driver cell to individually address the cells. A current-limiting resistor is interposed between the address line and the base of the corresponding first transistor of the cell. Diffused resistors are formed between the base and the emitters of each transistor to bleed-off excess charge build up and improve switching times. In addition, the diffused resistors act as a voltage divider when the transistors are not conducting, which allows for high voltage and, thus, low current operation.

Another aspect of the invention is a bipolar integrated ink jet printhead driver which uses a multiplicity of the driver cells described above. The driver cells are grouped into driver circuits having a common control line to enable the cells within the group. A number of address lines equal to the number of cells in the group are coupled to the driver circuits, each address line coupled to an individual driver cell in the group for addressing that cell. A resistive heater element is actuated by enabling a driver circuit and addressing the desired cell within the enabled driver circuit.

A further aspect of the invention includes a semiconductor fabrication method whereby the thin-film resistor material that is used to formed the resistive heater element is used as a resistive interconnect layer to connect the address lines to the driver cells.

An advantage of the invention is a simplified common collector drive transistor circuit.

Another advantage of the invention is a simple diffusion process to form the drive circuit.

A further advantage of the invention is the reduced number of address lines necessary to uniquely address and decode the individual printhead driver cells.

A yet further advantage of the invention is the use of higher operating voltages.

The foregoing and other objects, features and advantages of the invention will become more readily apparent from the following detailed description of a preferred embodiment of the invention which proceeds with reference to the accompanying drawings.

DETAILED DESCRIPTION

Figure 1A:
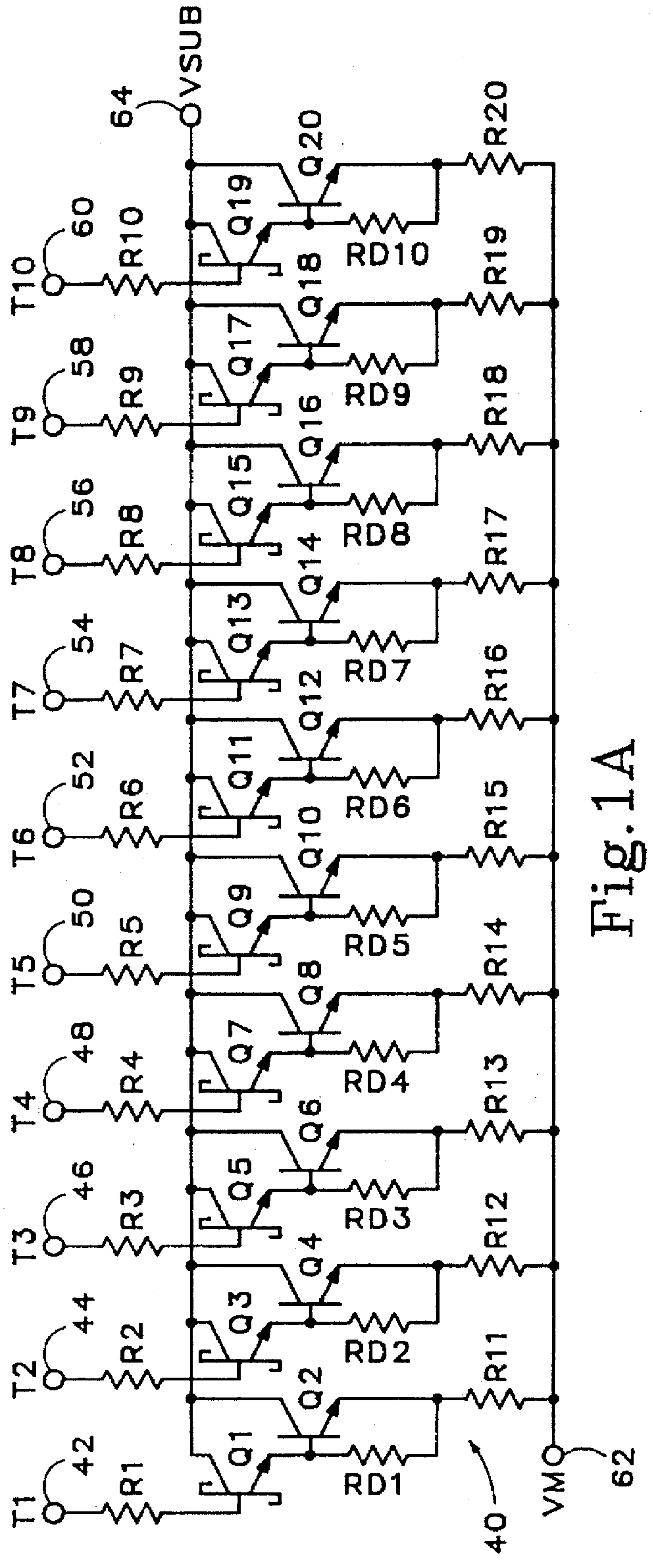
FIG. 1A is a schematic drawing of a first embodiment of a common collector ink-jet drive circuit according to the invention.

Referring to FIG. 1A, shown generally at 40 is an electrical schematic of a first embodiment of a bipolar integrated ink-jet driver circuit according to the invention. The driver circuit shown in FIG. 1A shows only ten thermal resistive elements R11–R20 for simplicity of illustration, however, the inventive principle can be extended to allow other numbers of resistive elements, limited primarily by the current carrying capacity of the conductors.

Associated with each resistive element R11–R20 are a first and a second bipolar NPN transistor, configured as a Darlington pair, i.e., with the emitter of the first transistor coupled to the base of the second transistor. The Darlington pair, as is known in the art of analog design, results in significantly higher current gain than results by using only a single transistor.

For example, consider a Darlington pair consisting of transistors Q1 and Q2, each having a base, a collector, and an emitter. The base of transistor Q1 is coupled to an address terminal 42 through current-limiting resistor R1. In the preferred embodiment, the first transistor in the pair, i.e., Q1, is a Schottky transistor. The Schottky transistor has a Schottky diode formed across the base to collector junction to avoid deeply saturating the first transistor, which results in faster switching times.

The collectors of the first and second transistors in the pair, Q1 and Q2, respectively, are coupled together to form a common collector node and to receive a DC voltage source $V_{SUB}$ received at a driver common collector terminal 64. The method of forming the common-collector node, with its apparent advantages, is described further below. The emitter of transistor Q1 is coupled to the base of transistor Q2 and further to the emitter of transistor Q2 through resistor RD1. The resistive heater element R11 is coupled between the emitter of transistor Q2 and a common control voltage terminal 62. Similarly, the transistors Q3–Q20 are connected in pairs to resistive elements R12–R20, respectively, to form nine other Darlington pairs as shown in FIG. 1A. Each Darlington transistor pair together with the corresponding resistive heater element forms a "driver cell."

In the preferred embodiment, the resistors R1–R20 are formed of Tantalum-Aluminum. In contrast, resistors RD1–RD10 are formed using a diffusion process, e.g., P diffusion using boron.

Each driver cell in FIG. 1A is individually addressable. By presenting an address signal on a selected address terminal (42–60), and enabling the control voltage $V_M$ on the control voltage terminal 62, the addressed Darlington pair outputs a current to the corresponding resistive element. For example, if an address signal T1 of +4 V is impressed upon address terminal 42 and control voltage $V_M$ of −10 V is presented at control terminal 62, while a $V_{SUB}$ of 0 V is on driver collector terminal 64, transistors Q1 and Q2 will turn on. Thus, a selected driver cell is enabled when both the corresponding address signal and control voltage are asserted. If transistors Q1 and Q2 are turned on, a current will be output to the resistive element R11, the energy dissipated by resistive element R11 will cause an ink droplet to be ejected from the corresponding nozzle (not shown). Each of the other resistive elements R12–R20 can be similarly enabled by addressing the corresponding address terminal. This addressing method can be extended to more than one driver cell by asserting an address signal on more than one address terminals (42–60) while the control voltage is asserted.

The amount of energy dissipated by the resistive element and the volume of the ink well controls the volume of ink contained in the resulting ink droplet. In order to control the print quality of the image produced by the ink droplets, the droplet volume must remain relatively constant. In the preferred embodiment of the invention, a temperature sense circuit (not shown) is used to sense the ambient temperature and adjust the energy dissipated by the heater element. The energy can be adjusted, for example, by reducing the pulse width of either the address signal or the control voltage.

Figure 1B:
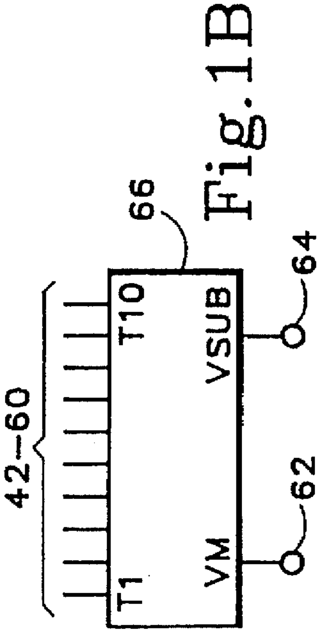
FIG. 1B is a block diagram symbol for the drive circuit of FIG. 1A.
Figure 2:
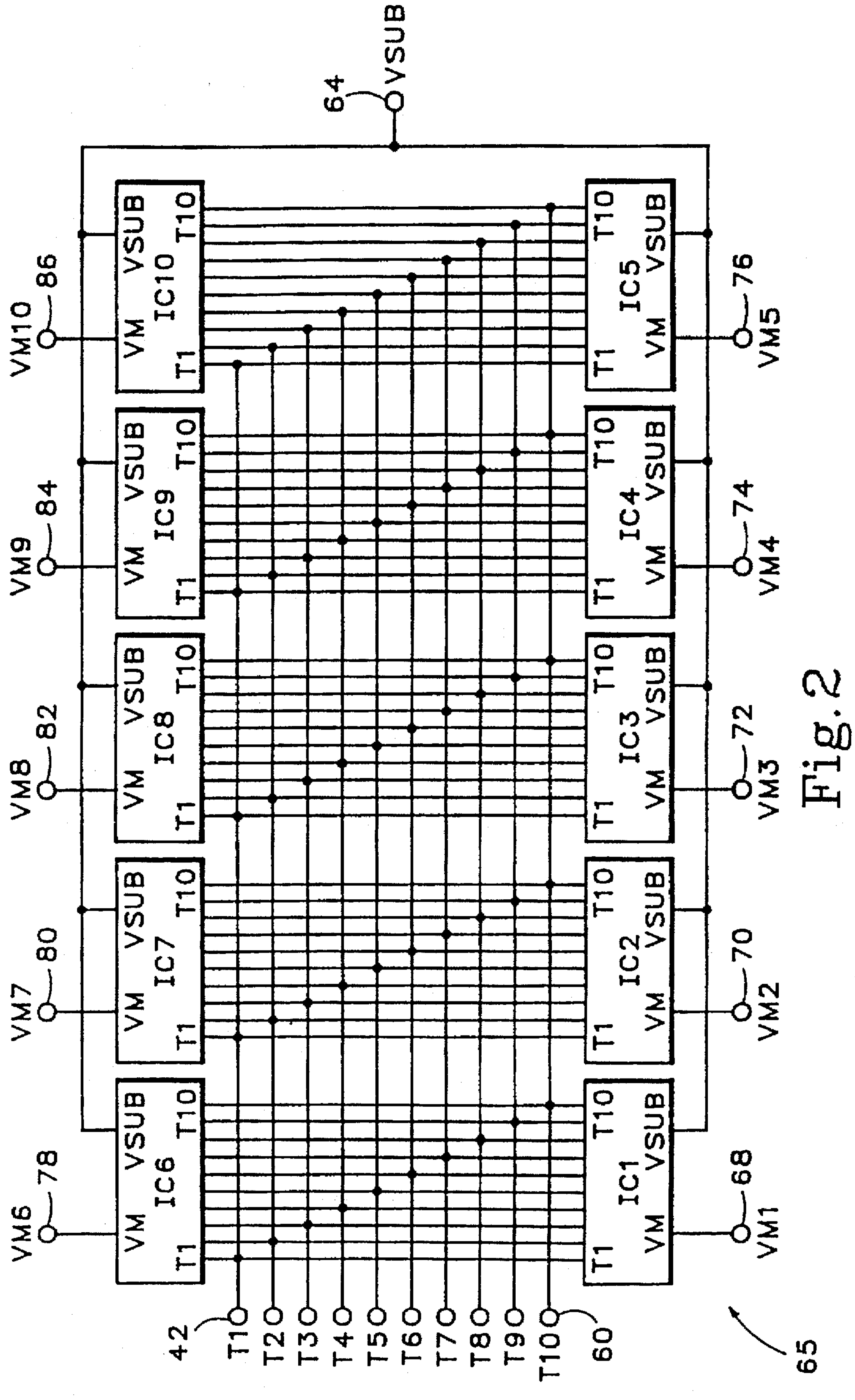
FIG. 2 is a block diagram schematic of a ink-jet drive circuit using a plurality of the circuits of FIG. 1.

A block diagram 66 of the driver circuit 40 is shown in FIG. 1B. The block diagram consists of the address terminals 42–60, control voltage terminal 62, and common collector terminal 64. The block diagram 66 can then be used as a sub-block in a printhead driver circuit 65 such as that shown in FIG. 2. By using driver circuit sub-blocks, an ink jet printhead can be constructed having any practical number of driver cells, limited by the yield of the resulting circuit. As shown in FIG. 2, the address terminals of each sub-block IC1–IC10 are commonly coupled to address lines T1–T10, and the driver common collector terminals are commonly coupled to DC voltage line 64. In contrast, the control terminal of each sub-block IC1–IC10 is coupled to a unique control line VM1–VM10, respectively.

By connecting the printhead driver circuit 65 in this way, each individual resistive element, and, therefore, each corresponding ink jet nozzle, is individually addressable using a reduced number of interconnects. Each resistive element within the sub-blocks is addressable by presenting an address signal on the address line coupled to the corresponding driver and enabling the corresponding control voltage signal coupled to the sub-block in which the driver resides. Thus, each of the resistive elements can be seen as an element in a two-dimensional array, wherein the corresponding X-coordinate corresponds to address signals T1–T10 and the Y-coordinate corresponds to control signals VM1–VM10. It is readily apparent that the number of conductors required to uniquely address the resistive elements is approximately equal to 2×[(No. Resistive Elements)^(½)]. The advantages of having a reduced number of conductors will become readily apparent in the description of the process described hereinafter.

Figure 3A:
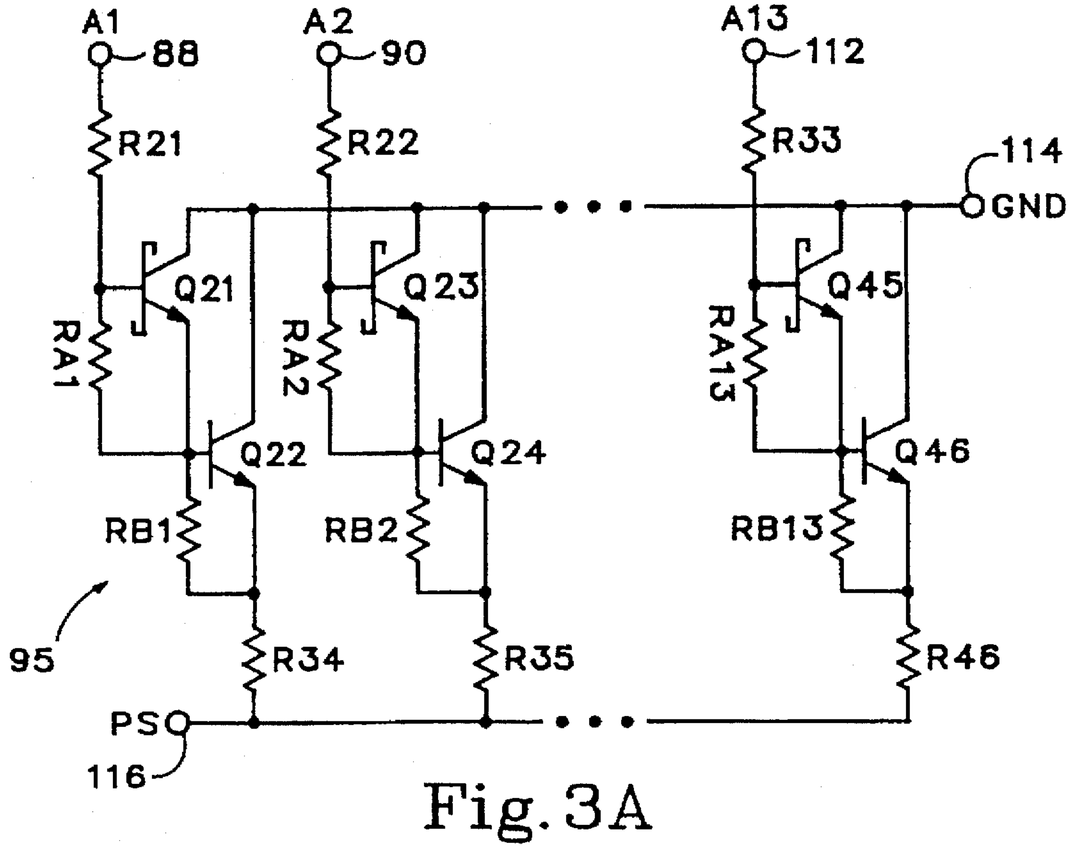
FIG. 3A is a schematic drawing of a second embodiment of a common collector ink-jet drive circuit according to the invention.
Figure 3B:
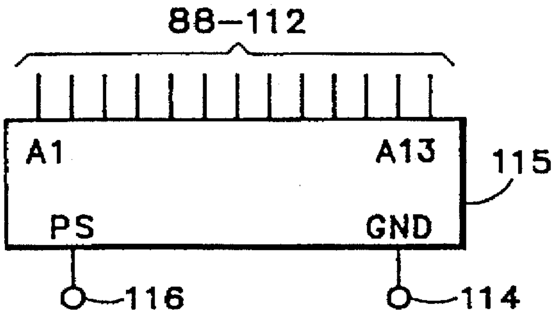
FIG. 3B is a block diagram symbol for the drive circuit of FIG. 3A.

A second embodiment of the invention is shown in FIGS. 3A and 3B, indicated generally at 95. Referring to FIG. 3A, the second embodiment differs from the first embodiment in two ways. First, the number of driver cells has changed from ten to thirteen. Accordingly, the number of address lines 88–112 has increased to thirteen correspondingly. Each address line 88–112 receives a unique address signal AS1–AS13, respectively. Second, coupled between the base and the emitter of each Schottky transistor is additional diffused resistor, e.g., RA1.

The diffused resistor RA1–RA13 between the base and emitter of the Schottky transistor is for bleeding charge off of the base and enhancing the speed of operation. Also, the diffused resistor RA1–RA13 inhibit reverse biasing the emitter-base junctions so as to prevent all the transistors Q21–Q46 from drawing excessive currents, which could degrade the betas (current gain) of the transistors. The resistors RA1–RA13, in combination with diffused resistors RB1–RB13, form a voltage divider so as to minimize the reverse potentials across each emitter-base junction $BV_{EB}$ when the transistor pair is not conducting current. As noted in the background of the invention, the reverse potential must be kept below 8 V in order to prevent degrading the transistor beta or, worse yet, potentially rendering the transistor inoperable. Thus, the diffused resistors RA1–RA13 and RB1–RB13 allow higher operating voltages to be used, which results in a corresponding decrease in the current levels.

A corresponding block diagram 115 of the printhead driver circuit 95 is shown in FIG. 3B. The block diagram 115 of FIG. 3B differs from that of FIG. 1B only in the number of address lines, i.e., thirteen versus ten, respectively. Similar to the block diagram of FIG. 1B, block diagram 115 also includes driver collector terminal 114 commonly coupled to the common driver collector nodes of transistors Q21–46, and control terminal 116 commonly coupled to the resistive elements R34–R46.

Figure 4:
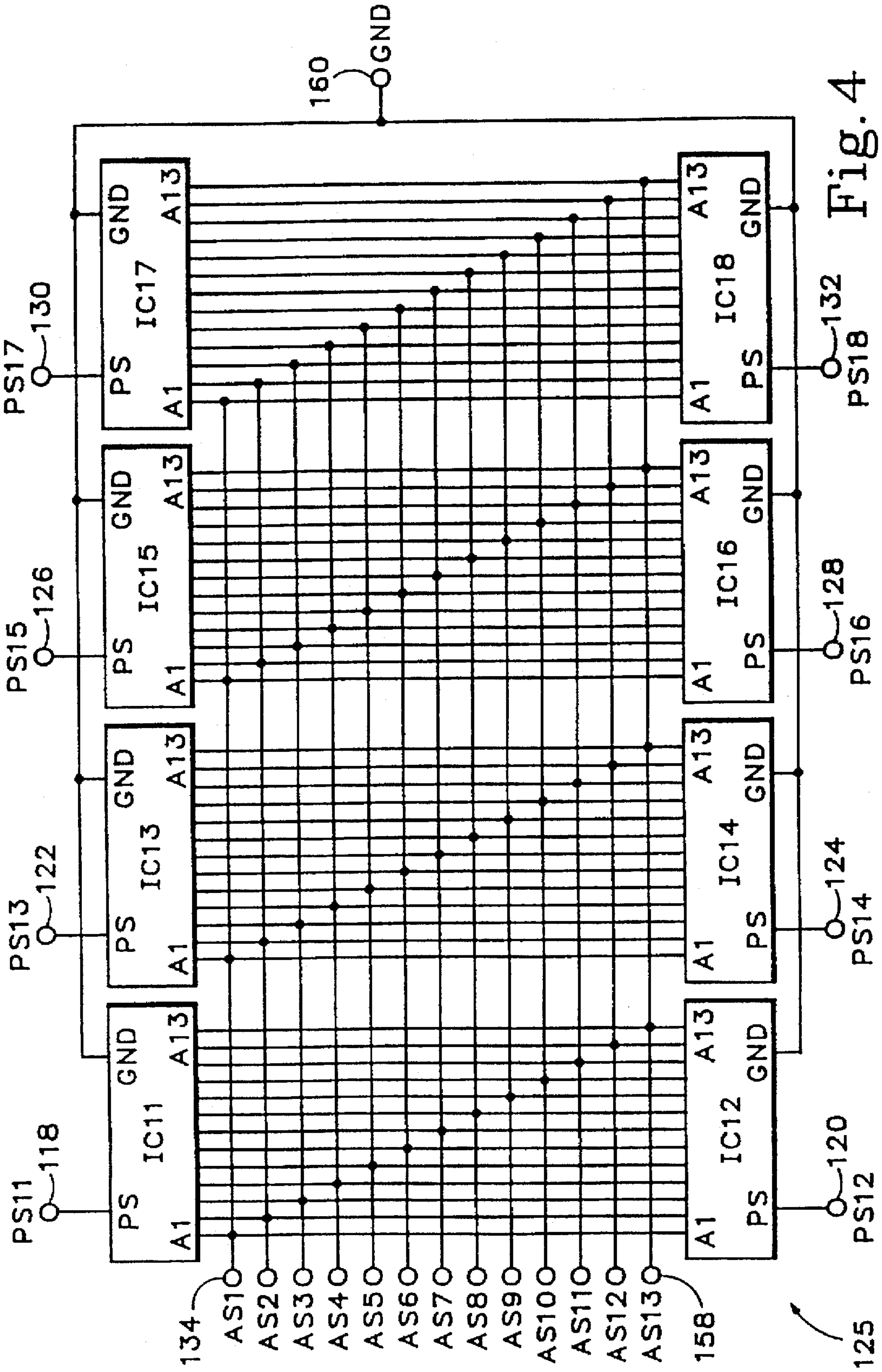
FIG. 4 is a block diagram schematic of an ink-jet drive circuit using a plurality of the circuits of FIG. 3.

A printhead driver circuit 125 using eight instances of the driver circuits of the block diagram 115 as sub-blocks, i.e., IC11–IC18, is shown in FIG. 4. The address terminals of each sub-block IC11–IC18 are commonly coupled to address lines 134–158 for receiving address signals AS1–AS13, respectively. Also, the collector terminals of sub-blocks IC11–IC18 are commonly coupled to a DC voltage source GND at supply terminal 160. As in FIG. 2, the driver circuits IC11–IC18 each have a separate control line 118–132, respectively. Each control line 118-132 receives a control signal PS1–PS8, respectively, for enabling a corresponding driver circuit. The individual driver cells are addressed in a similar manner as described above for the circuit of FIG. 2.

SEMICONDUCTOR FABRICATION PROCESS

Figure 5:
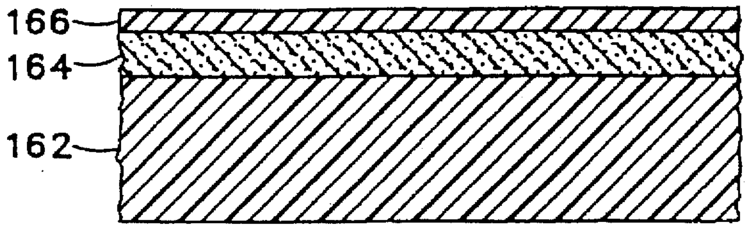
FIGS. 5–10 illustrate process steps for constructing the bipolar transistors of FIG. 1A and FIG. 3A.

Referring now to FIGS. 5–10, a process for constructing the bipolar common collector circuits of FIGS. 1 and 3 is shown. FIGS. 5–10 correspond to steps 1–12 of TABLE 1 below. Referring to FIG. 5, the process requires an N+ starting substrate 162, e.g., SB doped, having a 0.1–0.01 ohm-cm resistivity. An N-type epitaxial layer 164 is grown on the substrate 162 having a thickness of approximately 4–5 μm over Sb doped substrate interface. The epitaxial layer has a resistivity of approximately 1 ohm-cm. A thick (2 μm) oxide layer 166 is formed on the epitaxial layer 164 using a dry-wet-dry cycle over approximately 24 hrs.

Figure 6:
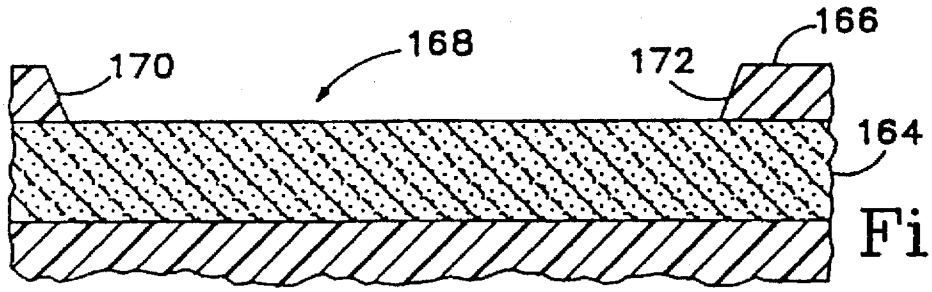

Referring to FIG. 6, a deep well 168 having sloped edges 170 and 172 is formed in oxide layer 166 using a first mask step.

Figure 7:
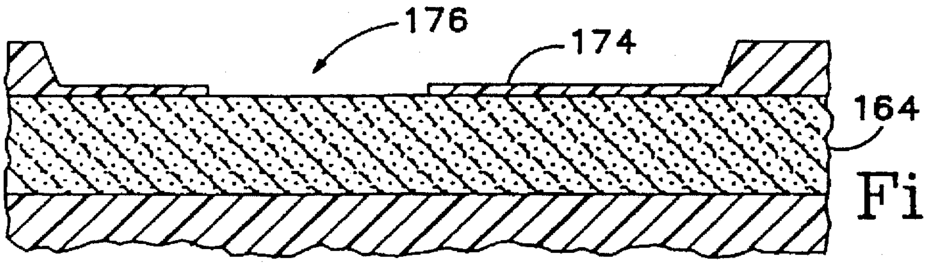

An additional 0.35 μm oxidation layer 174, i.e., re-ox, is grown for 0.5-1-1 hr., i.e., dry-wet-dry, at 1000° C. on the epitaxial layer 164. The timing and temperature can be varied to produce substantially the same result. A base region 176 and diffused resistor regions (not shown) are defined by removing a portion of the re-ox 174 using a second mask, as shown in FIG. 7.

Figure 8:
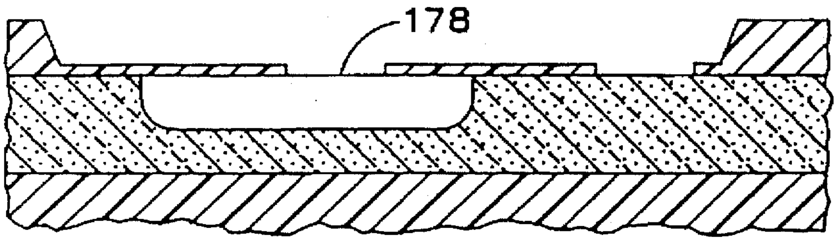

Referring to FIG. 8, once the base region 176 is defined, a base region 178 and diffused resistors (not shown) are formed using a two step process. First, boron, having a resistivity of approximately 100 ohm/sq., is predeposited in the base region. Second, the resulting oxidation layer is removed and the boron is diffused into the base region using a dry-wet-dry cycle for 1-0.5-2 hr. Alternatively, ion implantation could be used to form the base and diffused resistors.

Figure 9:
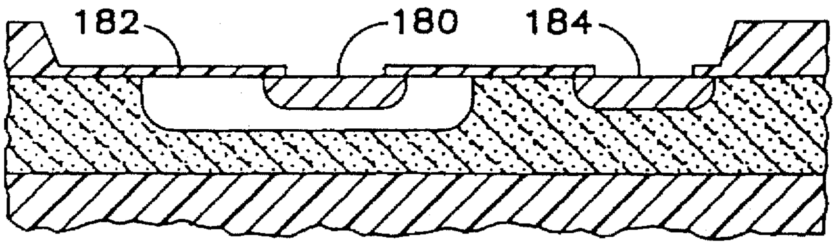

Referring now to FIG. 9, a third mask step is used to define emitter and collector contact regions, as well as to form the substrate contacts (not shown). An emitter 180 and a collector 184 are then diffused, using phosphorous, by a two-step process similar to that used to form the base 178. The emitter and collector are diffused to a depth 1 μm to 1.5 μm having 3 ohm/sq ~2,000Å oxide in dry-wet-dry cycle. A hydrofluoric acid dip is applied after the first step to the oxide surface to remove any remaining phosphorous. This prevents the phosphorous after predeposition from interacting with the first metal layer, which could create process or reliability problems.

Figure 10:
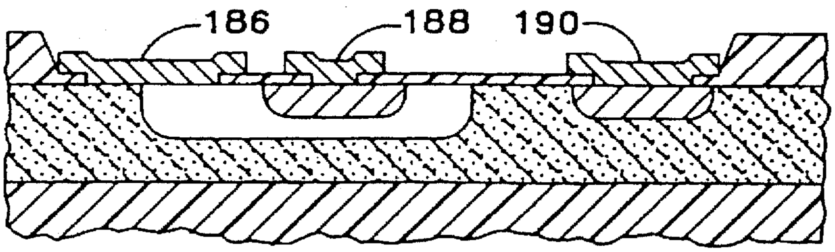

As shown in FIG. 10, a base contact 186, an emitter contact 188, and a collector contact 190 are formed by depositing a first metal layer over the wafer and etching away the unneeded metal. In the preferred embodiment the first layer metal consists of a composite of two metals Tantalum-Aluminum ("TaAl") and Aluminum-Copper ("AlCu"). The composite first layer metal ("TaAl/AlCu") is formed by successively depositing the TaAl and then the AlCu. The TaAl makes good contact with the underlying silicon wafer. As described further below, the TaAl is used to also form the thin film resistors as well as the thermal resistive elements. The entire bipolar diffusion process is outlined in steps 1–12 in Table 1 below. A detailed description of the first and subsequent metal layers follows with respect to FIG. 11 and FIG. 11B.

Figure 11:
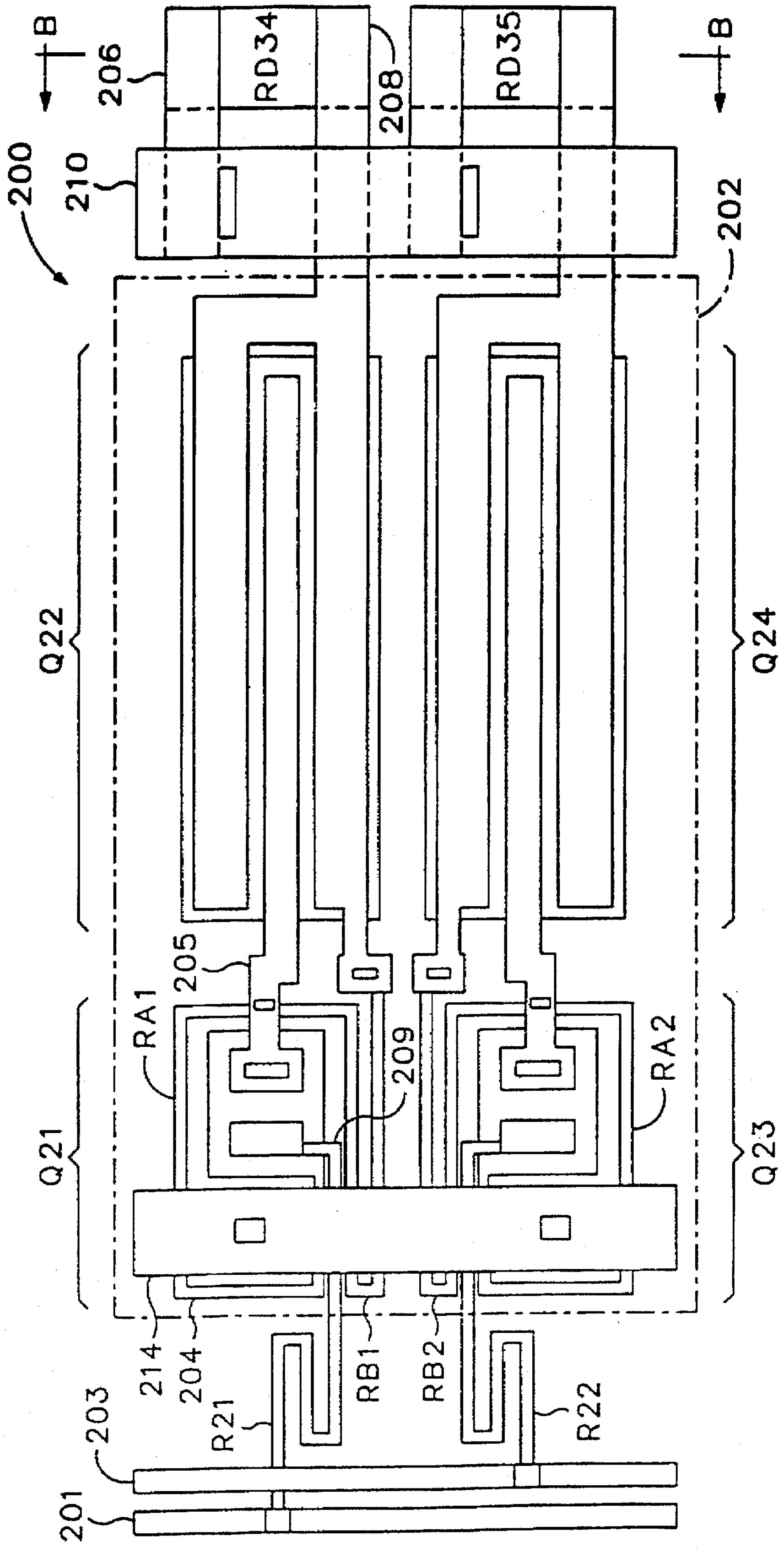
FIG. 11 is a layout of two pairs of drive transistors and their associated resistive element.

Referring to FIG. 11, a plan view of a layout 200 of two adjacent driver cells is shown. FIG. 11 shows address lines 201, 203, Darlington pairs Q21–Q22 and Q23–Q24, and corresponding resistive heater elements R34 and R35, respectively. In the preferred embodiment, the emitters of transistors Q22 and Q24 are formed using a segmented emitter structure. The collectors of the transistors are merged together in a single epitaxial layer of the integrated circuit, however, for simplicity of illustration, only the interconnect layers are shown in FIG. 11. The layout shown can be modified, constrained by the design rules of the particular process, while not departing from the inventive principle.

The driver pairs shown in FIG. 11 correspond to the first two driver cells of FIG. 3A. The first driver pair consists of transistors Q21 and Q22, and the second driver pair consists of transistors Q23 and Q24. The transistors Q21–Q24 are formed in a deep well 202 using the bipolar process described above. The description which follows refers to only a single driver pair, i.e., Q21 and Q22, however, the second driver pair, as well as all of the other driver pairs, are formed in substantially the same manner.

The layout 200 is used as a cell to form the entire circuit of FIG. 4. The cell is replicated and each replicated cell abuts an adjacent cell so as to form a linear array of cells. The number of cells is determined by the number of desired inkjet nozzles on the corresponding printhead (not shown). In the preferred embodiment, as shown schematically in FIG. 4, two parallel linear arrays of cells are formed to drive two parallel rows of inkjet nozzles (not shown). Each array is the mirror image of the other, with respect to the address lines 134–158.

Figure 14:
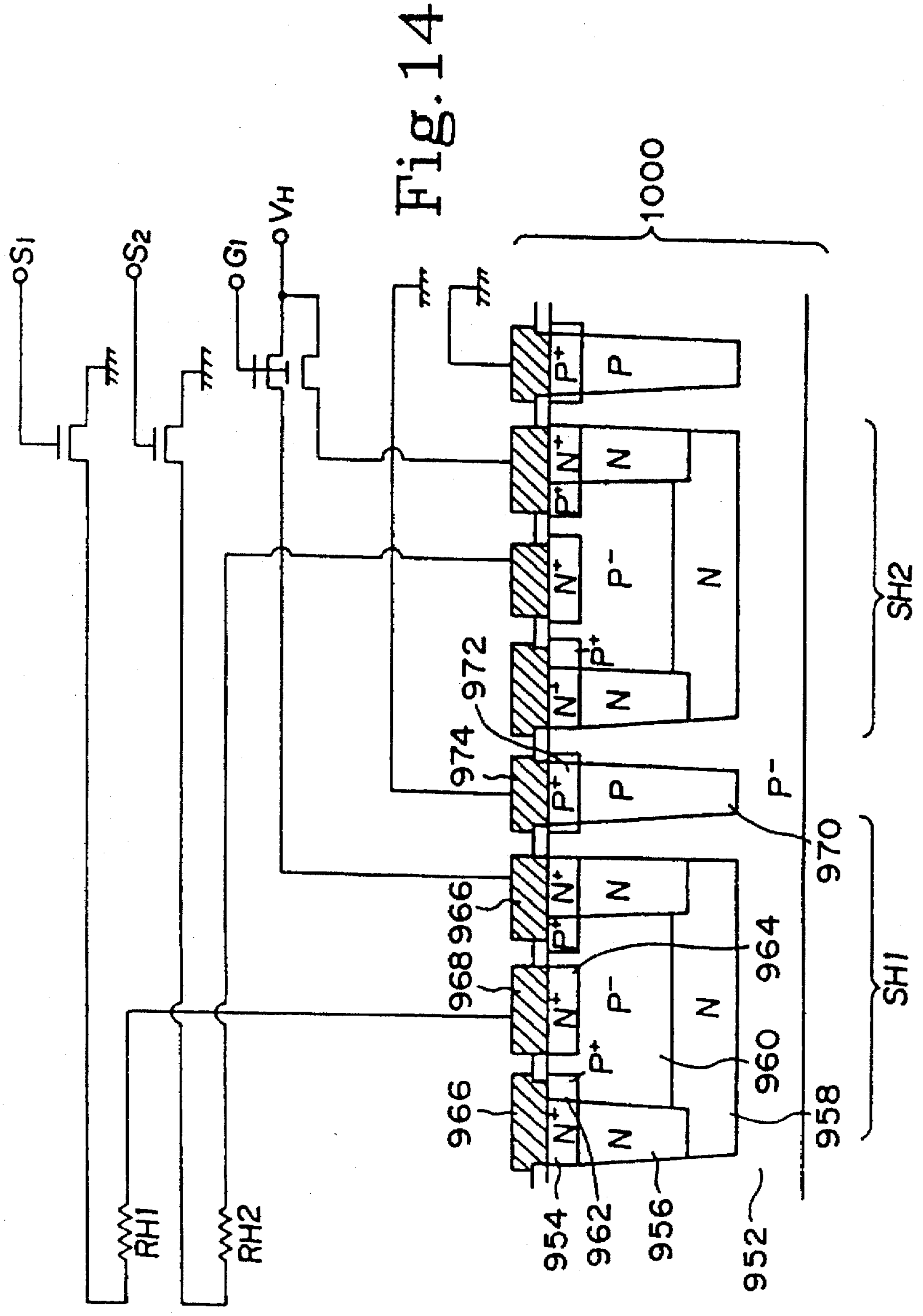
FIG. 14 is a cross-section of a prior art ink jet printhead driver showing an isolation domain between adjacent driver transistors.

Notable in FIG. 11 is the absence of any isolation domain between the first and second driver pairs. Unlike the prior art reference shown in FIG. 14, the driver circuit shown in FIG. 11 does not require any isolation, such as buried layer, isolation, or collector wall diffusions, between adjacent drivers, other than the minimum separation dictated by the design rules. This design, therefore, allows adjacent drivers to be "packed" closer together resulting a smaller silicon die and a potential corresponding reduction in the spacing between resistive elements. The reduction in the spacing between resistive elements RD34 and RD35 could potentially increase the overall resolution of a printhead that employs these circuits.

Once the first layer of metal TaAl/AlCu is deposited, as described above, the first layer of metal is sintered in an $N_2$ environment at approximately 450° C. (Step 14 in Table 1) to form an Al-Cu-Si alloy. Next, in steps 15–16, the interconnects and resistive elements are formed. In a first photolithographic and etching step (Step 15) the widths of the interconnect and resistive are patterned by etching the TaAl/AlCu. In a second photolithographic and etching step (Step 16) the resistor lengths are defined. In the second step, only the AlCu is etched away to expose the resistive heater elements RD34 and RD35 and resistors R21 and R22, as shown in FIG. 1.

The resistors R21 and R22 are made sufficiently narrow and of sufficient length to form the desired resistance. In the preferred embodiment, thin-film resistor R21 has a resistance of approximately 4KΩ. As with the thin-film resistor R21, the dimensions of the resistive heater element RD34 can be adjusted to produce the desire resistance. In the preferred embodiment, heater element RD34 has a resistance of 30Ω.

Interconnects 201, 205, 206, and 208 are similarly formed from the TaAl/AlCu layer. Interconnect 206 connects the heater element RD34 to a control line 210 (formed in a subsequent step) and interconnect 208 connects the heater element RD34 to the emitter of transistor Q22 as well as to diffused resistor RB1. In addition, the AlCu is retained on top of the TaAl where additional contacts and interconnects are required. Thus, the TaAl/AlCu layer forms the basic interconnect means between the two transistors in the pair and between the drivers and the resistive elements.

After the resistors and interconnects are formed, an insulating layer is deposited (Step 17) over the substrate. In the preferred embodiment, a layer of silicon-carbide/silicon-nitride ("SiCx/SiNx") is deposited by PECVD techniques.

The SiCx/SiNx is used as a thermal and pressure shock barrier to insulate the driver circuitry from the shock caused by the rapid thermal expansion and physical shock caused by the ink ejection. Vias are then formed in the insulating layer, where contacts are desired to the underlying metal layer, through an additional mask step (Step 18).

Optionally, a cavitation layer of metal can be deposited over the insulating layer (Step 17A). The cavitation layer is deposited and then etched (Step 17B) to leave a portion of the cavitation layer over the resistive heater elements RD34 and RD35. The cavitation layer of metal is used to minimize cavitation in the insulating layer caused by the corrosive ink (not shown). In the preferred embodiment, the third layer consists of Tantalum ("Ta").

A second layer of metal is then deposited and etched away to form the top level interconnect. In the preferred embodiment, the second layer or metal is comprised of Tantalum-Gold ("TaAu"). The gold is used because of its low resistivity and high current carrying capability, while the tantalum provides adherence for the gold to the underlying oxide. The top level interconnect forms the major contacts throughout the driver circuit. The top level interconnect forms address lines 201 and 203, control line 210, and common-collector line 214. In the preferred embodiment.

Finally, a photosensitive plastic barrier layer is formed (Step 22) over the circuit 200 to prevent the corrosive ink from coming into contact with the circuit. Ink wells are etched away (Step 23) over the heater elements and the external bonding pad areas (not shown) are exposed. An electroplated orifice plate is formed separately and the orifices are positioned over the ink wells to form the complete integrated ink jet printhead. Finally, a ink channel (not shown) is formed from the bottom of the substrate in order to supply ink to the ink wells. The ink channel can be formed through sand-blasting or similar techniques.

Figure 11B:
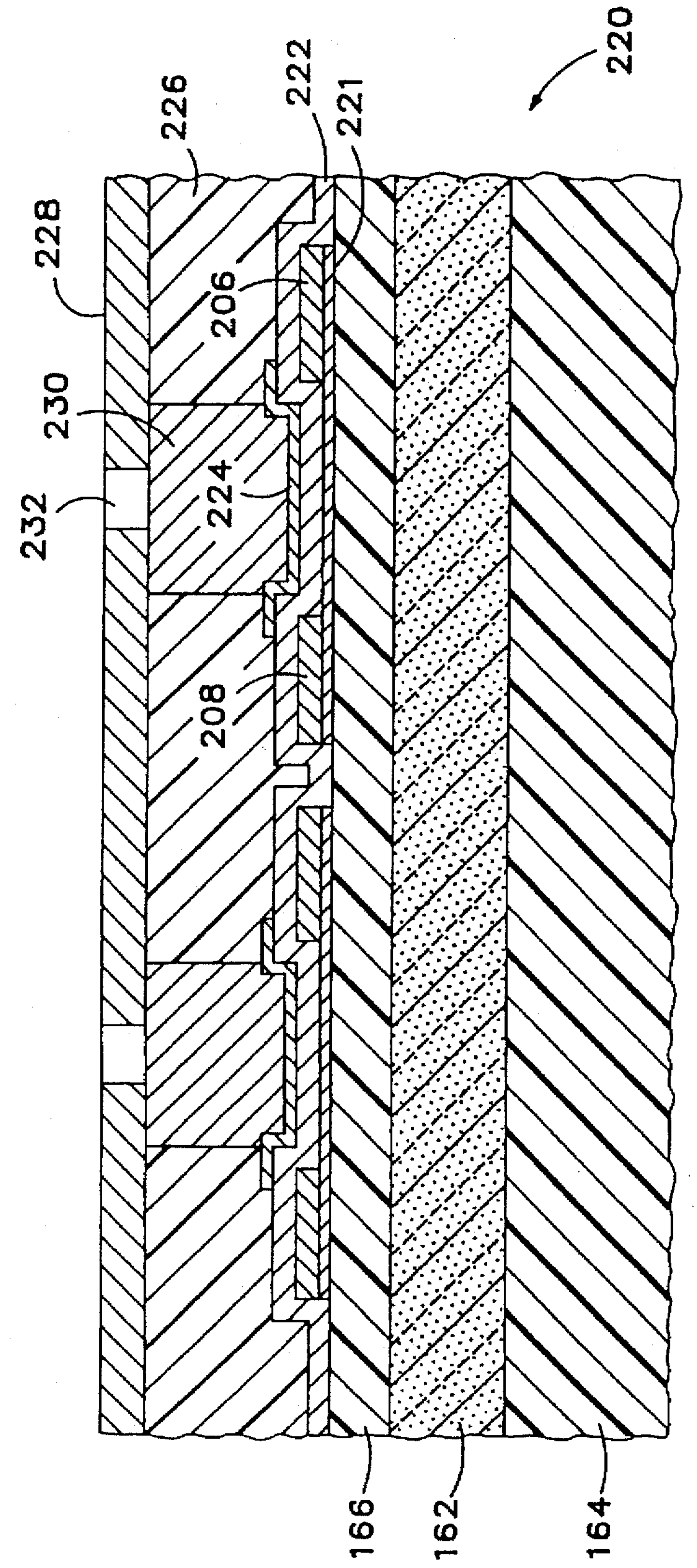
FIG. 11B is a cross-section of the driver circuit of FIG. 11 taken along line B—B in FIG. 11.
Figure 12:
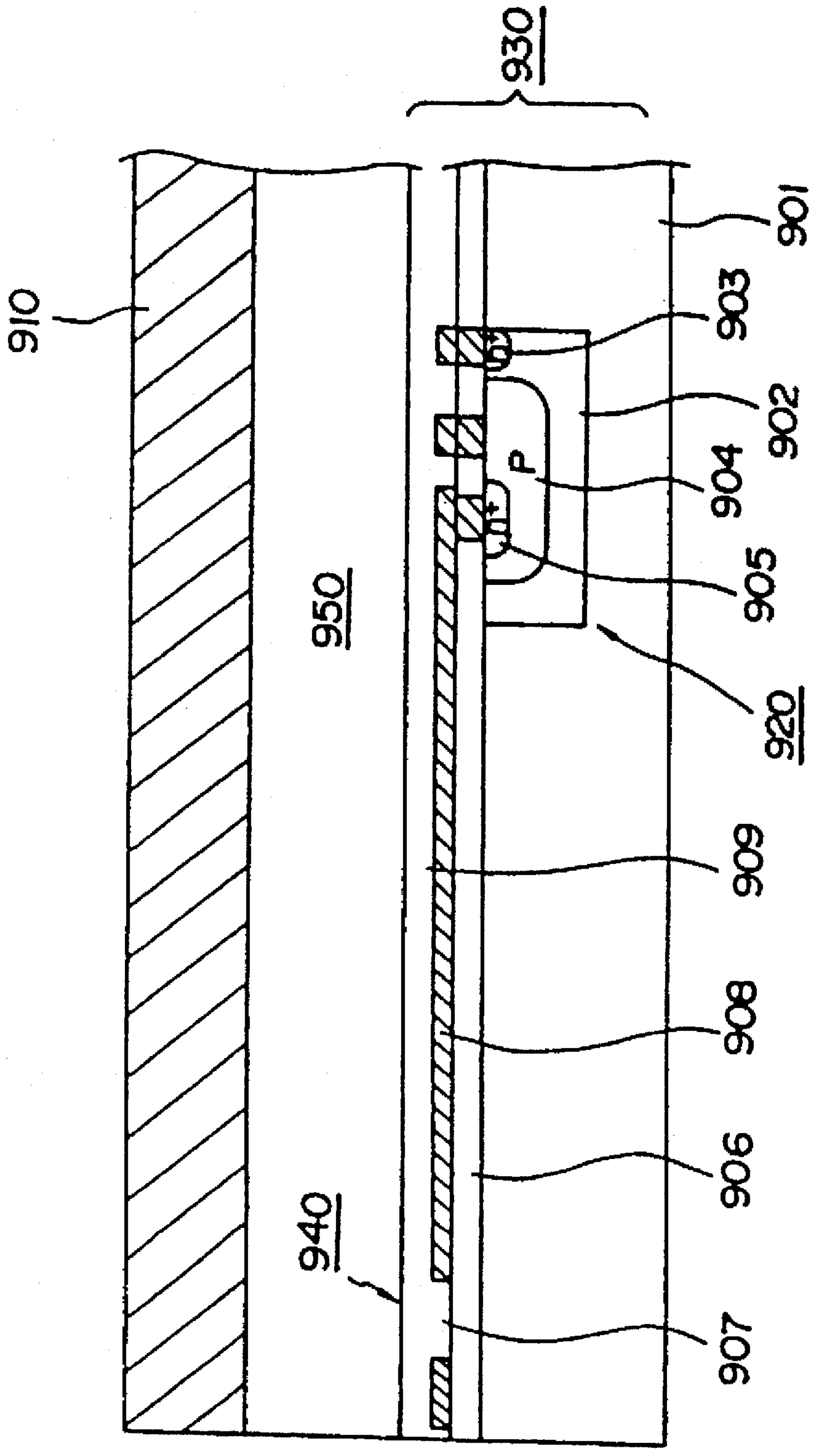
Fig.12 (PRIOR ART)
FIG. 12 is a cross-section of a prior art ink jet printhead driver.
Figure 13:
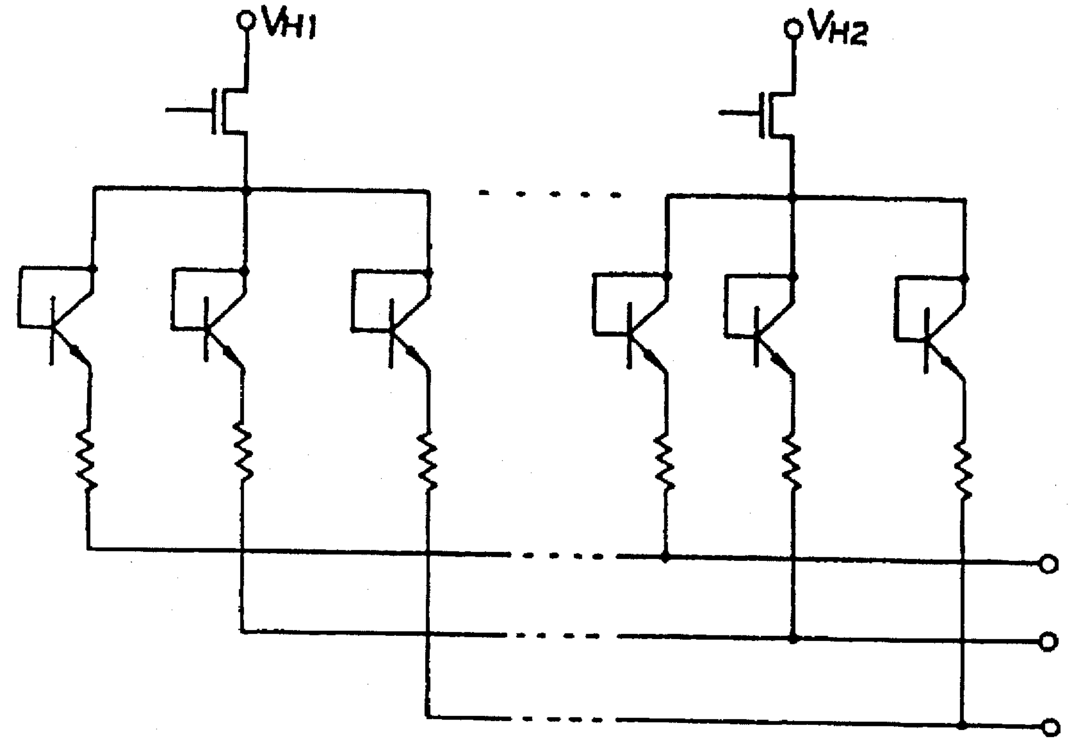
FIG. 13 is a schematic drawing of a prior art ink jet printhead driver circuit.

Referring now to FIG. 11B, a cross-section 220 of the heater elements RD34 and RD35, taken along line B—B in FIG. 11, is shown. A strip of TaAl 221 forms the heater element RD34. Located at opposite ends of the TaAl strip 221, in electrical contact therewith, are interconnects 206 and 208 formed of AlCu. An insulating layer of SiCx/SiNx 222 is shown, which covers the TaAl strip 221 and the Al interconnects 206 and 208 at B—B. A strip of Ta 224 is shown located directly over the heater element RD34, formed from TaAl strip 221, to minimize cavitation of the insulating layer 222. An ink barrier 226 is shown covering the cross-section, with the exception of the area over the heater element, to form an ink well 230 directly over the heater element. Finally, an orifice plate 228 is placed over the ink barrier with an orifice 232 formed directly over the ink well 230. The heater RD34, ink well 230, and orifice 232 for the nozzle is structure of the printhead. This nozzle structure is substantially identical for each nozzle in the printhead.

TABLE 1

Process flow table

Bipolar Diffusion Process.

| | | | |
|---|---|---|---|
| 1. | Wafer: | | |
| | | a. Resistivity: | .1 to .01 ohm-cm; |
| | | b. Type: | Sb doped. |
| 2. | Grow epi: | | |
| | | a. Resistivity: | 1 ohm-cm. |
| | | b. Thickness: | ~4 μm (over interface); |

TABLE 1-continued

| Process flow table | | |
|---|---|---|
| 3. | Oxidize: | |
| | a. Thickness: | 20,000 A; |
| | b. Cycle: | dry-wet-dry cycle for 24 hrs. |
| 4. | Mask 1: Deep well. | Sloped edges. |
| 5. | Re-ox: | |
| | a. Cycle: | .5–1-1 hr. @ 1000 C.; |
| | b. Thickness: | 3,500 A. |
| 6. | Mask 2: Base | 3,500 A oxide. |
| 7. | Predep Boron: | ~100 ohm/sq. - delaze. |
| 8. | Base Drive: | |
| | a. Cycle: | dry-wet-dry, 1–.5–2 hr.; |
| | b. Depth: | 1.5 μm to 2.0 μm; |
| | c. Oxide: | ~3,000 A ox., ~200 ohm/sq. |
| 9. | Mask 3. | |
| | a. Purpose: | Emitter/collector |
| | b. Depth: | 3,500 A |
| 10. | Emitter Diff: | |
| | a. Predep (deglaze) - phosphorous ~5 ohm/sq. | |
| | b. Hydrofluoric Acid dip | |
| 11. | Emitter Drive: (phos free surface) | |
| | a. Depth: | 1 μm to 1.5 μm; |
| | b. Resistivity: | 3 ohm/sq; |
| | c. Thickness: | ~2,000 A ox in dry-wet-dry cycle. |
| 12. | Mask 4: | |
| | a. Purpose: | Contact base and emitter; |
| | b. Depth: | 3,000 to 4,000 A ox. |
| | Metallization Process | |
| 13. | Deposit: Sputter | |
| | a. Deposit: | TaAl; |
| | b. Deposit: | AlCu. |
| 14. | Sinter/alloy: 450 C. in $N_2$. | |
| 15. | Mask 1A: Define widths - etch TaAl/AlCu; | |
| 16. | Mask 2A: Define resistors - etch AlCu. | |
| 17. | Deposit: Sputter SiCx/SiNx. | |
| 17A. | Deposit: Ta (optional) | |
| 17B. | Mask 2B: Define cavitation plate (optional) | |
| 18. | Mask 3A: Via. | |
| 19. | Deposit: Sputter TaAu. | |
| 20. | Mask 4A: Top interconnect - etch TaAu. | |
| 21. | Add photosensitive plastic barrier layer - | |
| | a. form ink wells; | |
| | b. pad areas. | |
| 22. | Form Orifices: | |
| | a. Electroplated orifice. | |
| | b. Attach orifice plate to substrate | |
| 23. | Form ink channel | |

Having described and illustrated the principles of the invention in a preferred embodiment thereof, it is apparent to those skilled in the art that the invention can be modified in arrangement and detail without departing from such principles. I therefore claim all modifications and variation coming within the spirit and scope of the following claims.

I claim:

1. A method of fabricating an integrated inkjet printhead comprising:

forming a driver circuit on a silicon wafer substrate, the circuit having a base, a collector, and an emitter;

depositing a first layer of metal over the driver circuit;

defining from the first layer of metal a decoding resistor and a resistive heater element, the decoding resistor coupled to the base of the circuit;

defining an interconnect from the first layer of metal between the emitter of the circuit and the heater element;

depositing an insulation layer;

forming openings in the insulation layer to expose selected portions of the first layer of metal;

depositing a second layer of metal;

defining from the second layer of metal an address line between the decoding resistor and a bonding pad for receiving an address signal, a supply line between the collector of the circuit and a bonding pad for receiving a supply voltage, and a control line between the resistive element and a bonding pad for receiving a control voltage.

2. A method of fabricating an integrated bipolar inkjet printhead according to claim 1 further comprising the step of depositing a cavitation layer of metal on the insulating layer and defining a strip of the cavitation layer directly over the resistive element.

3. A method of fabricating an integrated bipolar inkjet printhead according to claim 2 wherein the step of depositing cavitation layer comprises depositing a layer of Tantalum.

4. A method of fabricating an integrated bipolar inkjet printhead according to claim 1 further comprising:

forming a plastic barrier layer; and forming ink wells over the resistive elements and pad area over the pads in the plastic barrier.

5. A method of fabricating an integrated bipolar inkjet printhead according to claim 1 further comprising the step of forming an electroplated orifice plate having orifices formed thereon; and placing the orifices directly over the resistive elements to form ink jet nozzles.

6. A method of fabricating an integrated bipolar inkier printhead according to claim 1 wherein the step of depositing a first layer of metal comprises depositing a composite layer of Tantalum-Aluminum and Aluminum-Copper.

7. A method of fabricating an integrated bipolar inkier printhead according to claim 1 wherein the step of depositing a second layer of metal comprises depositing a layer of Tantalum-Gold.

8. A method of fabricating an integrated bipolar inkjet printhead according to claim 1 wherein the step of forming a driver circuit comprises:

forming a first bipolar transistor having a base, a collector, and an emitter, the base of the first transistor coupled to the base of the driver circuit; and forming a second bipolar transistor having a base coupled to the emitter of the first transistor, a collector coupled to the collector of the first transistor, and an emitter coupled to the emitter of the driver circuit.

9. A method of fabricating an integrated bipolar inkier printhead according to claim 8 wherein the step of forming a driver circuit further comprises forming a Schottky diode across the base and collector of the first transistor.

10. A method of fabricating an integrated bipolar inkier printhead according to claim 8 wherein the step of forming a driver circuit further comprises forming diffused resistors between the base and emitter of the first transistor and between the base and emitter of the second transistor, wherein the diffused resistors act as a potential divider across the base to emitter junctions.

* * * * *